United States Patent [19]
Laakkonen

[11] Patent Number: 6,043,760
[45] Date of Patent: Mar. 28, 2000

[54] LANGUAGE-DEPENDENT LETTER INPUT BY MEANS OF NUMBER KEYS

[75] Inventor: Kimmo Laakkonen, Salo, Finland

[73] Assignee: Nokia Mobile Phones Ltd., Espoo, Finland

[21] Appl. No.: 09/017,391

[22] Filed: Feb. 2, 1998

[30] Foreign Application Priority Data

Feb. 4, 1997 [FI] Finland ..................... 970468

[51] Int. Cl.[7] .................................. H03M 11/00
[52] U.S. Cl. ................. 341/22; 341/26; 379/368; 345/168; 708/142
[58] Field of Search ................. 341/20, 22, 28, 341/23, 26; 379/368, 93.19; 708/142, 145; 345/168; 400/486; 364/703; 209/364

[56] References Cited

U.S. PATENT DOCUMENTS

| | | | |
|---|---|---|---|
| 4,427,848 | 1/1984 | Tsakanikas | 179/2 DP |
| 4,709,387 | 11/1987 | Masuda | 379/354 |
| 4,918,721 | 4/1990 | Hashimoto | 379/96 |
| 5,258,748 | 11/1993 | Jones | 345/172 |
| 5,266,949 | 11/1993 | Rossi | 341/22 |
| 5,339,358 | 8/1994 | Danish | 341/23 |
| 5,408,060 | 4/1995 | Muurinen | 200/314 |
| 5,523,754 | 6/1996 | Eisen et al. | 341/23 |
| 5,721,542 | 2/1998 | Shpater | 341/23 |

FOREIGN PATENT DOCUMENTS

| | | |
|---|---|---|
| 0 588 538 A1 | 3/1994 | European Pat. Off. . |
| 0 732 646 A2 | 9/1996 | European Pat. Off. . |
| 0 733 963 A2 | 9/1996 | European Pat. Off. . |
| 0 733 963 A3 | 9/1996 | European Pat. Off. . |

*Primary Examiner*—Michael Horabik
*Assistant Examiner*—Albert K. Wong
*Attorney, Agent, or Firm*—Perman & Green, LLP

[57] ABSTRACT

In an apparatus with a limited keypad (100, 300) several characters can be associated with each key. Characters associated with a key are determined on the basis of the language selected (200) as the operating language of the apparatus. The apparatus comprises a memory element (302) which includes a certain part (302a) for storing information indicating which set of the possible characters entered as push-button commands is in use as well as character set tables (302b–n) for selectively associating certain characters with each key on the basis of the information in said part (302a).

10 Claims, 2 Drawing Sheets

LANGUAGE-DEPENDENT LETTER INPUT BY MEANS OF NUMBER KEYS

The invention relates to the connection between characters input through a keypad to an electronic device and keystrokes. Particularly the invention relates to how several different characters can be input using one and the same key.

Portable phones, paging devices and other compact electronic apparatuses usually include a smallish keypad by means of which the user can issue push-button commands to the device. The most common keypad types have number keys from 0 to 9, special character keys * and # as well as a small number of function keys such as the start call and hangup keys.

Many above-mentioned devices have additional features the use of which requires input of letters and other characters to the device. Such functions include the sending of text messages and the use of alphanumeric memo functions. Due to the small size of the devices it is usually not possible to provide them with letter keypads such as those used in portable computers, but letters and special characters are entered using the number keys. Many mobile phones have a so-called ABC key which, when pressed, allows the user to choose whether he wants to input numbers or letters. Additionally, due to the large number of letters, several letters are associated with one key so that a first push of a key produces one letter, a second push of the key in rapid succession replaces the letter with another one and so forth. As there are about 25 to 30 letters in the Latin alphabet, depending on the language, there are usually about three letters associated to one number key.

There is however the problem that different languages that use the Latin alphabet have different letters and not all the letters appear in all the languages. Scandinavian languages, for example, have letters ä, ö, å, æ and ø which are not used in many other Latin-alphabet languages. The French are often particular about the correct use of accent marks so that characters ì, í and î have to be considered letters proper. Additionally, Icelandic, for example, has quite a number of letters which are not used in any other language. Greek has an alphabet of its own and most of the Slavonic languages are written in Cyrillic letters. In the area of former Yugoslavia some ethnic groups use Cyrillic letters and others use the Latin alphabet.

If we want to associate all or almost all the necessary characters with the number pad keys, we will easily get a great number of characters per key. Let us use the 2-key in the number keypad as an example: according to a widespread custom letters a, b and c are associated with that key. When a device equipped with such a keypad is used in the letter entering mode, a first push of the 2-key produces the letter a, the second push produces b, the third push produces c, and the fourth push produces the character 2. So we can say that the characters of the 2-key are "abc2". If we wish to associate with the 2-key all characters in the Latin-alphabet languages that are closely related to a, b and c, we would get something like "abc2aàáâäæç" as the sequence of characters associated with the 2-key; that is 11 characters in all. If a Danish user wants to use the device in his own language, he has to press one and the same key 10 times to produce the character æ on the display. Totally unnecessary are the presses used to skip characters á, â, à and ä, because these characters are not used at all in the Danish language.

An object of this invention is to provide a method and apparatus whereby a keypad having a limited number of keys can be flexibly used for entering desired letters and special characters.

The objects of the invention are achieved by associating letters and other characters with keys according to the language chosen as the operating language of the device.

The method according to the invention is characterised in that it comprises steps wherein
  information is produced concerning which set of the possible characters entered as push-button commands is in use and
  each key is associated with a subset of characters of the selected character set
  whereby, in response to n successive presses of a key, input is produced in the form of the character the ordinal number of which in the list of characters associated with that particular key corresponds to n.

The invention is also directed to an apparatus which is characterised in that it has a memory element connected to an electronic circuit interpreting push-button commands, said memory element comprising a part for storing information indicating which set of the possible characters entered as push-button commands is in use, and character set tables for selectively associating characters with keys according to the information in said part.

According to the invention the apparatus preferably associates with each key only characters that correspond to characters used in the language selected as the operating language for the apparatus. In an advantageous implementation keystrokes and the number of keystrokes have no physical connection with letters or characters, but the relations between the keystrokes and characters are made in an electronic circuit interpreting push-button commands. Changing of the characters associated with a key is carried out by a program which controls the operation of said circuit. The program receives as input a language selection by means of which the user or a programmer of the apparatus determines the language used. Since no physical changes are necessary, the number of languages as well as the number of characters associated with the languages are only limited by the size of the program memory in the apparatus. According to a proposal, all currently used letter, number and special characters will be represented by 16-bit Unicode bit sequences so that it will become possible to display over 65,000 different characters. If 130 kilobytes of the program memory in the apparatus can be reserved for the display of characters, all Unicode characters can be stored in memory and grouped into character sets so that the user can then select a character set to be used.

The invention is described in more detail with reference to the preferred embodiments presented by way of example and to the attached drawing where FIG. 1 shows a keypad wherein various character sets can be assigned to the keys, FIG. 2 shows in the form of a flow chart part of a program which realises the method according to the invention, and FIG. 3 shows in schematic fashion an apparatus according to the invention.

FIG. 1 shows a number keypad 100 which in outward appearance accords with a known arrangement, ie. its keys form a matrix of four rows and three columns. The middle key 101 in the top row corresponds to number 2 but has also certain letter characters associated with it. According to the invention the selection of letters associated with key 101 depends on the language selected as the operating language for the apparatus whereof the keypad 100 constitutes a part. In FIG. 1 a table 102 is shown on the right where rows correspond to operating languages and columns to keys in the keypad 100. Only part of the table 102 is shown so as to keep the graphic clear. The connections between key 101 and cells in table 102 are represented by arrows. If, for example, the operating language is Finnish (FI), key 101 corresponds to character sequence abc2äå in alphanumeric use, and if the operating language is Danish, key 101 corresponds to character sequence abc2åæ in the alphanumeric mode. On the basis of this pattern a person skilled in the art can easily construct the contents of the rest of the cells in table 102 and the connections between the keys and cells.

The mutual order of characters in the cells of table 102 refers to the order in which the characters are displayed (not shown) when the user presses the key in question in rapid succession. The alphabetical order shown in the figure serves illustrative purposes only, and a suitable mutual order of the characters associated with each key in alphanumeric use can be found by studying user preferences. It is also possible to have in the apparatus a memory element which keeps count of the characters entered through each key and dynamically arranges the characters associated with each key in such an order that the most often entered character of a certain key is displayed on one push of the key, the second most often entered character is displayed on two pushes of the key and so forth. Such an arrangement results in that the number of keystrokes required of the user is statistically as small as possible.

In addition to a language selection the rows in table 102 may also represent other situations affecting the selection of the character set. One option could be a row "ALL LETTERS" in table 102, corresponding to a situation in which the user wants that all possible letters are associated with the keys in accordance with a grouping rule. A grouping rule can be e.g. such that each key is associated with all the letters that can be considered to be related to the letters printed on the surface of the key. As letters abc are printed on key 101, letters abc2àáâãäæαβçχ, for example, could be associated with the key by the "ALL LETTERS" row of table 102. Since it is quite a number of letters that are then associated with each key, a particularly useful feature in this option is the aforementioned memory element which automatically keeps count of keystrokes and arranges the characters associated with a key in the order according to the frequency of use. Table 102 may also contain rows connected with certain symbol or special character sets so that letters or characters associated with a certain key are independent of any language proper. From the user's point of view, however, is simplest if the row selected from table 102 is determined on the basis of the active operating language so that the user needs not to think about which character set to use.

The simplest way of selecting an operating language is that the user interface comprises a language menu which includes all the operating language choices available. Using the general control functions of the user interface the user gets the language menu on the display and activates the language that he wants use.

FIG. 2 shows a simple flow chart which illustrates letter input through a number keypad in accordance with the method according to the invention. In block 200 the operation branches according to the operating language selected. To keep the diagram clear and simple, FIG. 2 only shows the branches corresponding to the selection of Finnish and Danish. In block 201 or 202 the apparatus detects which key in the keypad was pressed. For simplicity's sake the figure shows only those parts of the flow chart which are related to the pressing of the "2 abc" key. A person skilled in the art can easily construct similar decision chains for the rest of the keys on the basis of the pattern disclosed here. The decision chain of a key contains the characters that are associated with that key. In the decision blocks 203*a–f* or 204*a–f* the apparatus examines whether the user pressed within a predetermined repeat interval the same key again. The length of the repeat interval can be chosen in the same way as in keypad solutions according to the prior art. Depending on the current language branch in the flow chart, repeated presses of the key produce different character inputs, depicted by blocks 205*a–f* and 206*a–f*. The characters and their mutual order are chosen in the same manner as above in table 102 of FIG. 1. The operation continues outside the flow chart of FIG. 2 when the user presses e.g. the start call key or another key that ends the character input.

FIG. 2 uses an arrow to represent return from the last decision block 203*f* or 204*f* to the first if the number of repeated presses of a key exceeds the number of characters associated with the key. Generally it can be said that pressing a key n times in (rapid enough) succession will produce a character input the ordinal number of which in the list of characters associated with the key is [(n−1) mod m]+1, where m is the number of characters associated with the key. An embodiment can also be disclosed that has no return to the first decision block, but in order to produce a single character input each key can be pressed successively only as many times as there are characters associated with the key. Then, pressing a key n times in (rapid enough) succession will produce a character input consisting of (n−1) div m times the last character in the list of characters associated with the key as well as the character the ordinal number of which in the list is [(n−1) mod m]+1. According to this alternative, pressing the "2 abc" key seven times in succession in an arrangement otherwise according to FIG. 2 would produce a character input consisting of characters a and a when the operating language is Finnish (the first six presses would produce the character å and the next single press would produce the character a).

In a further embodiment of the invention, one has to press only once the key with which the characters according to the language selection are associated. In response to the press of the key the apparatus displays all characters associated with the key. The user can then use arrow keys to move the cursor (which is known from the prior art) on the display to the desired character and accept it by pressing, for example, an OK key.

The apparatus according to the invention comprises, in accordance with FIG. 3, a keypad 300, an electronic circuit 301 interpreting push-button commands entered at the keypad, and a memory element 302 which contains information in block 302*a* concerning the character set chosen (e.g. the languge selected) as well as several character set tables 302*b*–302*n* which store information about which characters are associated with the individual keys, depending on the contents of block 302*a*. Additionally, the memory block 302 includes program instructions according to which the circuit 301 functions. The connection between the circuit 301 and memory element 302 is preferably a two-way connection so that information stored in the memory element 302 can be altered e.g. with a push-button command corresponding to the choosing of a new operating language. Generally it is also possible to alter the information in the memory element in ways other than using push-button commands, e.g. through a special programming interface (not shown in the drawing). The reference designator 303 represents other parts of the apparatus the operation of which is controlled by the push-button commands.

The embodiments discussed are presented by way of example only, and it is obvious to a person skilled in the art that the inventive idea disclosed here can be modified within the scope of the invention defined by the claims set forth below.

I claim:

1. A method for producing character input in a portable terminal of a cellular radio system, the portable terminal having a numeric keypad (100, 300), characterised in that it comprises the steps of:
   (a) producing information (200) concerning which set of the possible characters entered as push-button commands is in use;
   (b) associating each key in the numeric keypad with a certain subset of characters belonging to the selected set of characters;
   (c) selecting a key associated with the desired subset of characters; and
   (d) pressing the key successively until the desired character is produced.

2. The method of claim 1, characterised in that in response to n successive presses of a key (203a–203f, 204a–204f) a character input is produced (205a–205f, 206a–206f) the ordinal number of which in the list of characters associated with the key in question corresponds to n.

3. The method of claim 2, characterised in that a character input is produced the ordinal number of which in the list of characters associated with the key in question is [(n−1) mod m]+1, where m is the number of characters associated with the key in question.

4. The method of claim 2, characterised in that a character input is produced which consists of (n−1) div m instances of the last character in the list of characters associated with the key in question and, in addition, the character the ordinal number of which in the list of characters associated with the key in question is [(n−1) mod m]+1.

5. The method of claim 1, characterised in that said information indicating which set of the possible characters entered as push-button commands is in use, is the same as information about the operating language of the apparatus, whereby the characters that belong to the alphabet of the operating language of the apparatus are used.

6. The method of claim 5, characterised in that it comprises stages for selecting an operating language, where
   the available languages are presented to the user in the form of a menu, and
   in response to an activation command issued by the user the language to which the activation command is directed is set as the operating language.

7. The method of claim 1, characterised in that the subsets of characters of the selected character set that are associated with the individual keys are arranged into lists in which the characters are in alphabetical order.

8. The method of claim 1, characterised in that the subsets of characters of the selected character set that are associated with the individual keys are arranged into lists in which the characters are in the order determined by the statistical frequency of use, the most frequently used character first.

9. The method of claim 1, characterised in that in response to a press of a key the characters associated with that key and the cursor are displayed, in response to presses of arrow keys indicating the direction of movement of the cursor said cursor is moved on the display, and in response to a press of an acceptance key a character input is produced consisting of the character at which the cursor is located on the display at the moment when the acceptance key is pressed.

10. A portable terminal of a cellular radio system equipped with a keypad (300) and including an electronic circuit (301) for converting presses of numeric keys into character inputs, characterised in that it comprises in connection with the electronic circuit a memory element (302) which includes a certain part (302a) for storing information indicating which set of the possible characters entered as successive push-button commands is in use as well as character set tables (302b–n) for selectively associating certain characters with each key on the basis of the information in said part (302a).

* * * * *

US006043760C1

(12) EX PARTE REEXAMINATION CERTIFICATE (9804th)
United States Patent
Laakkonen

(10) Number: US 6,043,760 C1
(45) Certificate Issued: Aug. 19, 2013

(54) LANGUAGE-DEPENDENT LETTER INPUT BY MEANS OF NUMBER KEYS

(75) Inventor: Kimmo Laakkonen, Salo (FI)

(73) Assignee: Mobilemedia Ideas LLC, Chevy Chase, MD (US)

Reexamination Request:
No. 90/012,233, Apr. 2, 2012
No. 90/012,367, Jun. 21, 2012

Reexamination Certificate for:
Patent No.: 6,043,760
Issued: Mar. 28, 2000
Appl. No.: 09/017,391
Filed: Feb. 2, 1998

(30) Foreign Application Priority Data

Feb. 4, 1997 (FI) .................................. 970468

(51) Int. Cl.
*H03M 11/00* (2006.01)

(52) U.S. Cl.
USPC ............. 341/22; 341/26; 345/168; 379/368; 708/142

(58) Field of Classification Search
None
See application file for complete search history.

(56) References Cited

To view the complete listing of prior art documents cited during the proceedings for Reexamination Control Numbers 90/012,233 and 90/012,367, please refer to the USPTO's public Patent Application Information Retrieval (PAIR) system under the Display References tab.

*Primary Examiner* — Joshua Campbell

(57) ABSTRACT

In an apparatus with a limited keypad (100, 300) several characters can be associated with each key. Characters associated with a key are determined on the basis of the language selected (200) as the operating language of the apparatus. The apparatus comprises a memory element (302) which includes a certain part (302a) for storing information indicating which set of the possible characters entered as push-button commands is in use as well as character set tables (302b-n) for selectively associating certain characters with each key on the basis of the information in said part (302a).

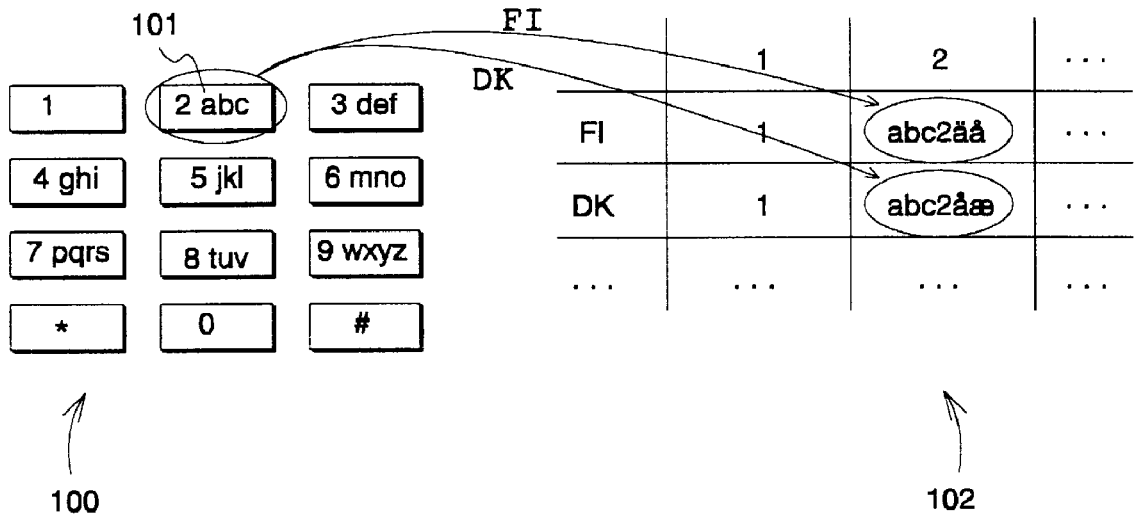

EX PARTE REEXAMINATION CERTIFICATE ISSUED UNDER 35 U.S.C. 307

Figure 1:
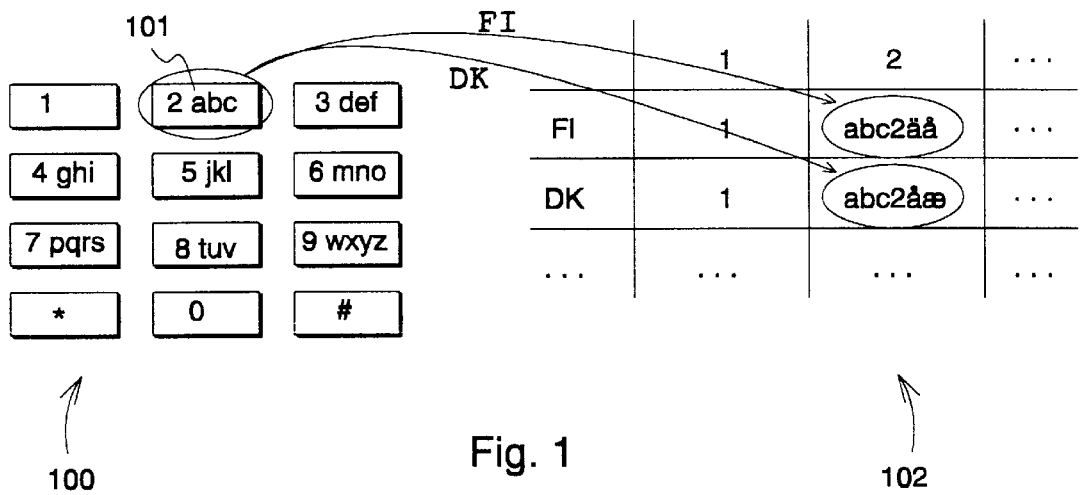
Figure 3:
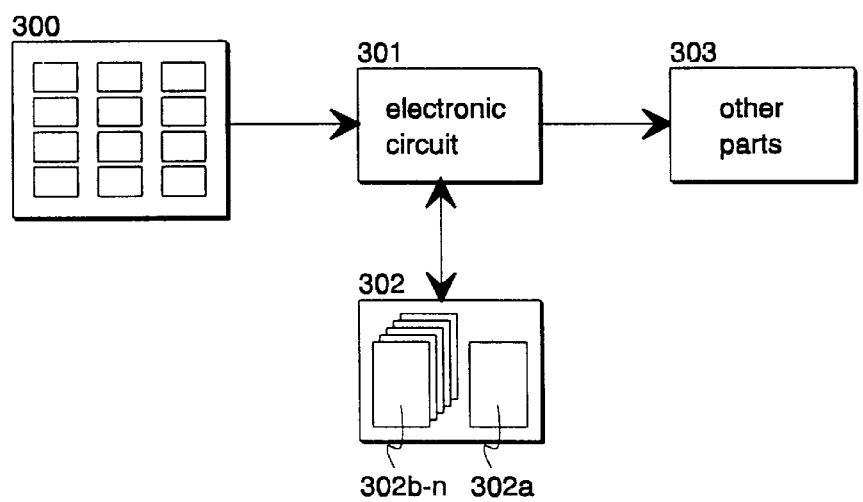
Figure 2:
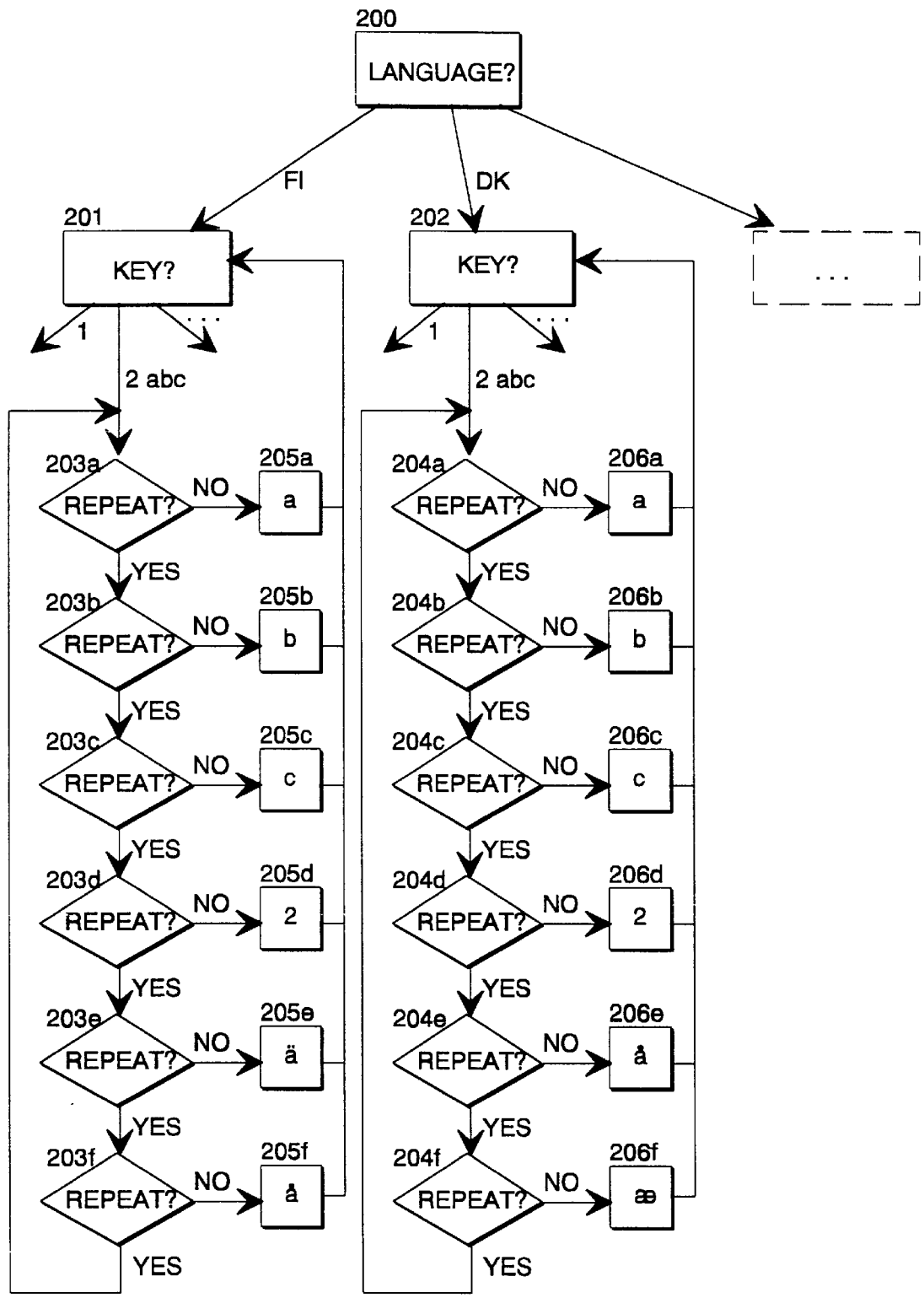

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 8 and 9 is confirmed.

Claims 1-7 and 10 are cancelled.

New claims 11-13 are added and determined to be patentable.

11. *A portable terminal of a cellular radio system equipped with a keypad (300) and including an electronic circuit (301) for converting presses of numeric keys into character inputs, characterised in that it comprises in connection with the electronic circuit a memory element (302) which includes a certain part (302a) for storing information indicating which set of the possible characters entered as successive push-button commands is in use as well as character set tables (302b-n) for selectively associating certain characters with each key on the basis of the information in said part (302a), and characterised in that the certain characters associated with each key in the character set tables are arranged into lists having an order determined by statistical frequency of use, the most frequently used character first.*

12. *A portable terminal of a cellular radio system equipped with a keypad (300) and including an electronic circuit (301) for converting presses of numeric keys into character inputs, characterised in that it comprises in connection with the electronic circuit a memory element (302) which includes a certain part (302a) for storing information indicating which set of the possible characters entered as successive push-button commands is in use as well as character set tables (302b-n) for selectively associating certain characters with each key on the basis of the information in said part (302a), said portable terminal further comprising a display, characterised in that the display presents all characters associated with a key in response to a press of the key for user selection.*

13. *A portable terminal of a cellular radio system equipped with a keypad (300) and including an electronic circuit (301) for converting presses of numeric keys into character inputs, characterised in that it comprises in connection with the electronic circuit a memory element (302) which includes a certain part (302a) for storing information indicating which set of the possible characters entered as successive push-button commands is in use as well as character set tables (302b-n) for selectively associating certain characters with each key on the basis of the information in said part (302a), wherein the memory stores special character sets for association with certain keys independently of any language.*

\* \* \* \* \*